(12) United States Patent
Haibara et al.

(10) Patent No.: US 9,773,688 B2
(45) Date of Patent: Sep. 26, 2017

(54) ULTRASONIC CLEANING METHOD AND ULTRASONIC CLEANING APPARATUS

(71) Applicant: Siltronic AG, Munich (DE)

(72) Inventors: Teruo Haibara, Hikari (JP); Etsuko Kubo, Yokkaichi (JP); Yoshihiro Mori, Shunan (JP); Masashi Uchibe, Izumo (JP)

(73) Assignee: SILTRONIC AG, Munich (DE)

( * ) Notice: Subject to any disclaimer, the term of this patent is extended or adjusted under 35 U.S.C. 154(b) by 563 days.

(21) Appl. No.: 13/891,236

(22) Filed: May 10, 2013

(65) Prior Publication Data

US 2013/0312785 A1    Nov. 28, 2013

(30) Foreign Application Priority Data

May 24, 2012    (JP) .................................. 2012-118634

(51) Int. Cl.
  *B08B 3/12*         (2006.01)
  *H01L 21/67*        (2006.01)

(52) U.S. Cl.
  CPC .......... *H01L 21/67057* (2013.01); *B08B 3/12* (2013.01)

(58) Field of Classification Search
  CPC .. B08B 3/00; B08B 3/04; B08B 3/044; B08B 3/10; B08B 3/048; B08B 3/102; B08B 3/12; B08B 5/00; H01L 21/02052
  USPC ........................ 134/1.1, 1.3, 34, 36, 37, 42
  See application file for complete search history.

(56) References Cited

U.S. PATENT DOCUMENTS

| | | | |
|---|---|---|---|
| 3,326,534 A * | 6/1967 | Pryde | 416/229 R |
| 5,017,281 A * | 5/1991 | Sadeghi et al. | 208/390 |
| 5,985,811 A | 11/1999 | Masayuki et al. | |
| 6,058,945 A * | 5/2000 | Fujiyama et al. | 134/1.3 |
| 7,726,325 B2 * | 6/2010 | Saiki et al. | 134/184 |
| 8,026,496 B2 | 9/2011 | Barker et al. | |
| 2002/0096189 A1 | 7/2002 | Kume | |
| 2003/0010353 A1* | 1/2003 | Kawasaki et al. | 134/1 |
| 2005/0115594 A1 | 6/2005 | Hosoda et al. | |
| 2006/0061225 A1 | 3/2006 | Beck et al. | |
| 2006/0137719 A1* | 6/2006 | Hasegawa et al. | 134/25.4 |
| 2007/0220806 A1* | 9/2007 | Ewart et al. | 47/1.4 |
| 2007/0223916 A1 | 9/2007 | Higuchi et al. | |

(Continued)

FOREIGN PATENT DOCUMENTS

| JP | 60113719 A | 6/1985 |
|---|---|---|
| JP | 0133879 U | 2/1989 |

(Continued)

OTHER PUBLICATIONS

Definition of sonoluminescence-Free Online Dictionary, Feb. 13, 2014, p. 1.*

(Continued)

*Primary Examiner* — Bibi Carrillo
(74) *Attorney, Agent, or Firm* — Leydig, Voit & Mayer, Ltd.

(57) ABSTRACT

An ultrasonic cleaning method for cleaning an object in a liquid in which a gas is dissolved includes preparing the liquid in which the gas is dissolved and stirring the liquid while irradiating the liquid with the ultrasonic waves so as to realize a state where bubbles containing the gas dissolved in the liquid continue to be generated. The object is cleaned in the state where the bubbles containing the gas continue to be generated.

19 Claims, 3 Drawing Sheets

(56) References Cited

U.S. PATENT DOCUMENTS

| | | | | |
|---|---|---|---|---|
| 2007/0231612 | A1* | 10/2007 | Naoe | 428/842 |
| 2007/0267040 | A1* | 11/2007 | Watanabe et al. | 134/1 |
| 2008/0276960 | A1 | 11/2008 | Holsteyns et al. | |
| 2010/0291639 | A1* | 11/2010 | Ackermann | 435/105 |
| 2011/0272836 | A1* | 11/2011 | Keegan et al. | 264/5 |
| 2013/0160791 | A1* | 6/2013 | Haibara et al. | 134/1 |
| 2013/0312785 | A1* | 11/2013 | Haibara et al. | 134/1 |
| 2013/0312786 | A1* | 11/2013 | Mori et al. | 134/1 |
| 2013/0312788 | A1* | 11/2013 | Kubo et al. | 134/1.3 |
| 2013/0312789 | A1* | 11/2013 | Uchibe et al. | 134/1.3 |

FOREIGN PATENT DOCUMENTS

| | | |
|---|---|---|
| JP | 10109072 A | 4/1998 |
| JP | 200357164 A | 2/2003 |
| JP | 2005093873 A | 4/2005 |
| JP | 2005296868 A | 10/2005 |
| JP | 2007250726 A | 9/2007 |
| JP | 2007288134 A | 11/2007 |
| JP | 5015717 B2 | 5/2009 |
| JP | 2011119514 A | 6/2011 |
| JP | 2012081430 A | 4/2012 |
| TW | 496786 B | 8/2002 |
| WO | WO 03047777 A2 | 6/2003 |

OTHER PUBLICATIONS

"Behaviour of a Well Designed Megasonic Cleaning System", Solid State Penomena Cols. 103-104 (Dec. 2005) pp. 155-158.

"Megasonics: A cavitation driven process", Solid State Phenomena vols. 103-104 (Dec. 2005) pp. 159-162).

Hatanaka, et al., Sonoluminescence of Alkali-Metal Atoms in Sulfuric Acid: Comparison between Ultrasonic Horn and Cleaner, Proceedings of Symposium on Ultrasonic Electronics, Dec. 6-8, 2010, vol. 31, pp. 431-432.

* cited by examiner

ULTRASONIC CLEANING METHOD AND ULTRASONIC CLEANING APPARATUS

CROSS REFERENCE TO RELATED APPLICATIONS

This application claims priority to Japanese Patent Application No. JP2012-118634, filed May 24, 2012, which is hereby incorporated by reference herein in its entirety.

FIELD

The present invention relates to an ultrasonic cleaning method and an ultrasonic cleaning apparatus, and particularly to an ultrasonic cleaning method and an ultrasonic cleaning apparatus for cleaning an object to be cleaned in a liquid in which a gas is dissolved, by irradiating the liquid with ultrasonic waves.

BACKGROUND

In a process of manufacturing a substrate such as a silicon wafer, a substrate cleaning process of an immersion type, a single wafer type or the like has been conventionally conducted in order to remove, from the substrate, organic substances, metallic impurities, particles, natural oxide films and the like that cause a defect in a semiconductor device.

In the substrate cleaning process, various types of cleaning methods have been used depending on its purpose. Particularly when the immersion-type cleaning method is used to remove foreign substances such as particles, use is made of a method for immersing the substrate in a cleaning liquid contained in a cleaning tank and irradiating the cleaning liquid in which the substrate is immersed with ultrasonic waves having a frequency of around 1 MHz, which is called megasonic. It is generally believed that when the ultrasonic waves having a frequency of around 1 MHz are used, damage to the substrate can be reduced and the cleaning effect on submicron-size fine particles on the substrate surface can be increased.

It has been known that a concentration of a dissolved gas in the cleaning liquid affects the efficiency of removal of the foreign substances such as particles. It has been found that when ultrapure water is used as the cleaning liquid and the ultrapure water is irradiated with megasonic to remove the particles from the substrate, for example, a rate of removal of the particles from the substrate is affected by a dissolved nitrogen concentration in the cleaning liquid. More specifically, when the dissolved gas concentration in the cleaning liquid is within a prescribed range, the rate of removal of the particles from the substrate is relatively high (Japanese Patent Laying-Open Nos. JP10-109072A and JP2007-250726A). Therefore, by monitoring the dissolved gas concentration such as the dissolved nitrogen concentration in the cleaning liquid and controlling the dissolved gas concentration in the cleaning liquid to fall within a certain range in the cleaning process, it becomes theoretically possible to remove the particles effectively.

On the other hand, there is a report that the behavior of removal of the particles from the substrate is somehow related to the behavior of weak light emission (sonoluminescence) that occurs when the cleaning liquid is irradiated with the ultrasonic waves ("Behaviour of a Well Designed Megasonic Cleaning System", Solid State Phenomena Vols. 103-104 (2005) pp. 155-158; "Megasonics: A cavitation driven process", Solid State Phenomena Vols. 103-104 (2005) pp. 159-162).

SUMMARY

In an embodiment, the present invention provides an ultrasonic cleaning method for cleaning an object in a liquid in which a gas is dissolved includes preparing the liquid in which the gas is dissolved and stirring the liquid while irradiating the liquid with the ultrasonic waves so as to realize a state where bubbles containing the gas dissolved in the liquid continue to be generated. The object is cleaned in the state where the bubbles containing the gas continue to be generated.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
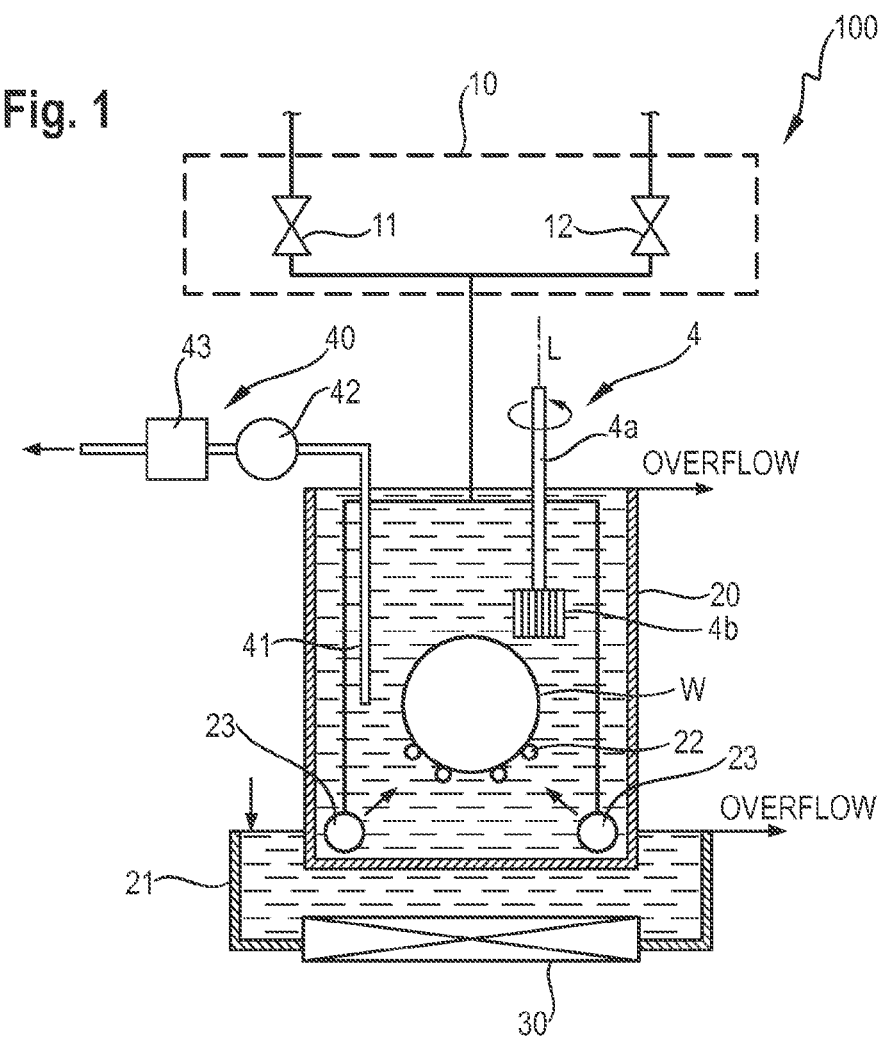
FIG. 1 is a schematic view showing an ultrasonic cleaning apparatus according to one embodiment of the present invention.

As a result of studies on ultrasonic cleaning of a substrate that have been conducted in the past by the inventors, it has turned out that a particle removal rate may be high or low even under the same dissolved gas concentration and the same ultrasonic irradiation conditions. Therefore, it has been difficult to realize a state having a high particle removal rate in a stable manner, simply by adjusting the dissolved gas concentration and the ultrasonic irradiation conditions.

The present invention has been made in light of the aforementioned problem, and an object of the present invention is to provide an ultrasonic cleaning method and an ultrasonic cleaning apparatus by which a high particle removal rate is obtained in a stable manner.

The inventors have earnestly studied a relationship between the dissolved gas concentration and the particle removal rate, and as a result, have obtained the following findings. Specifically, the inventors have found that, by stirring a liquid having a certain range of dissolved gas concentration while irradiating the liquid with ultrasonic waves, the particle removal rate of the liquid can be increased, and the inventors have arrived at the present invention.

An ultrasonic cleaning method according to the present invention is an ultrasonic cleaning method for cleaning an object to be cleaned in a liquid in which a gas is dissolved, by irradiating the liquid with ultrasonic waves, and the method has the following steps. The liquid in which the gas is dissolved is prepared. The liquid is stirred while the liquid is irradiated with the ultrasonic waves, and a state where bubbles containing the gas dissolved in the liquid continue to be generated is realized. The object to be cleaned is cleaned in the state where the bubbles containing the gas continue to be generated.

In the ultrasonic cleaning method according to the present invention, the liquid is stirred while the liquid is irradiated with the ultrasonic waves. Therefore, it is possible to realize the state where the bubbles containing the gas dissolved in the liquid are more likely to be generated continuously. Since cleaning is done in this state, a high particle removal rate can be obtained in a stable manner.

Preferably, in the ultrasonic cleaning method, the step of realizing a state where bubbles containing the gas continue to be generated is triggered by driving a stirring portion in the liquid. With this, generation of bubbles serving as nuclei is promoted on the surface of the stirring portion, and the cleaning effect can be enhanced.

Preferably, in the ultrasonic cleaning method, the step of cleaning the object to be cleaned includes a step in which sonoluminescence occurs. With this, a high particle removal rate is obtained in a more stable manner.

Preferably, in the ultrasonic cleaning method, the gas is nitrogen and a dissolved gas concentration in the liquid is 5 ppm or more and less than 11 ppm.

An ultrasonic cleaning apparatus according to the present invention is an ultrasonic cleaning apparatus for cleaning an object to be cleaned in a liquid in which a gas is dissolved, by irradiating the liquid with ultrasonic waves, the apparatus having: irradiation device for irradiating the liquid with the ultrasonic waves; a container for containing the liquid; and a mechanism for stirring the liquid. With the mechanism for stirring the liquid, the liquid can be stirred and it is possible to realize the state where the bubbles serving as nuclei are more likely to be generated in the liquid. As a result, the cleaning effect can be enhanced and a high particle removal rate can be obtained in a stable manner.

According to the present invention, there can be provided an ultrasonic cleaning method and an ultrasonic cleaning apparatus by which a high particle removal rate is obtained in a stable manner.

An embodiment of the present invention will be described hereinafter with reference to the drawings, in which the same reference characters are given to the same or corresponding portions and description thereof will not be repeated.

First, a configuration of an ultrasonic cleaning apparatus according to one embodiment of the present invention will be described.

As shown in FIG. 1, an ultrasonic cleaning apparatus 100 according to the present embodiment has: a cleaning tank 20 storing therein a cleaning liquid such as ultrapure water; a supply 10 for supplying the cleaning liquid to this cleaning tank 20; an indirect water tank 21 housing cleaning tank 20; irradiation device 30 arranged at the bottom of indirect water tank 21, for providing ultrasonic waves; monitoring device 40 for monitoring a dissolved nitrogen concentration in the cleaning liquid supplied into cleaning tank 20; and a stirring portion 4 serving as a mechanism for stirring the liquid. Supply 10 has a first supply valve 11 for supplying ultrapure water in which a nitrogen gas is dissolved to cleaning tank 20, and a second supply valve 12 for supplying degassed ultrapure water to cleaning tank 20.

First supply valve 11 is connected to a not-shown first tank. The ultrapure water in which the nitrogen gas is dissolved is stored in the first tank. Second supply valve 12 is connected to a not-shown degassed water manufacturing apparatus. Ultrapure water is supplied to the degassed water manufacturing apparatus, where a dissolved gas in the ultrapure water can be removed through a degassing membrane. The ultrapure water in which the nitrogen gas is dissolved and the degassed ultrapure water are mixed because pipes connected to first supply valve 11 and second supply valve 12 merge into one pipe on the downstream side of first supply valve 11 and second supply valve 12. A mixing tank (not shown) may be arranged on the downstream side of first supply valve 11 and second supply valve 12. In this case, the ultrapure water in which the nitrogen gas is dissolved and the degassed ultrapure water can be completely mixed in this mixing tank.

The mixed ultrapure water is then supplied to a liquid introducing pipe 23 through a pipe connected to the downstream side of aforementioned first supply valve 11 and second supply valve 12 and disposed within cleaning tank 20. Liquid introducing pipe 23 is disposed near an outer circumferential end of the bottom surface of cleaning tank 20. By adjusting the degree of opening of first supply valve 11 and second supply valve 12, the dissolved nitrogen concentration in the ultrapure water introduced into cleaning tank 20 as well as an amount of supply thereof can be controlled.

Liquid introducing pipe 23 is provided with a plurality of not-shown nozzles. Through these nozzles, the ultrapure water, which is the cleaning liquid, is supplied from liquid introducing pipe 23 into cleaning tank 20. The plurality of nozzles are spaced apart from one another along the direction in which liquid introducing pipe 23 extends. These nozzles are arranged so as to inject the cleaning liquid toward almost the central portion of cleaning tank 20 (region where a wafer W, which is an object to be cleaned, is held).

Cleaning tank 20 is a container for containing the cleaning liquid and a holding portion 22 for holding wafer W is disposed within cleaning tank 20. A semiconductor wafer, for example, can be used as wafer W. With wafer W being held by holding portion 22 in cleaning tank 20, the cleaning liquid constituted by the aforementioned mixed ultrapure water is supplied from liquid introducing pipe 23 into cleaning tank 20.

As described above, liquid introducing pipe 23 is disposed at the lower part of cleaning tank 20 (near the bottom wall or in a region located at the outer circumferential portion of the bottom wall that connects the bottom wall and the sidewall). A prescribed amount of the cleaning liquid (mixed ultrapure water) is supplied from liquid introducing pipe 23 into cleaning tank 20. The amount of supply of the cleaning liquid is adjusted such that cleaning tank 20 is filled with the cleaning liquid and a prescribed amount of the cleaning liquid overflows from the upper part of cleaning tank 20. As a result, wafer W is immersed in the cleaning liquid in cleaning tank 20 as shown in FIG. 1.

A supply line (not shown) for a medium different from the medium supplied by aforementioned supply 10 is connected to indirect water tank 21. Water serving as the medium is supplied from this supply line into indirect water tank 21. At least the bottom wall of aforementioned cleaning tank 20 is in contact with the water stored in indirect water tank 21. A prescribed amount of the water continues to be supplied from the supply line to indirect water tank 21, and thereby a certain amount of the water overflows from indirect water tank 21.

Irradiation device 30 is arranged to be connected to the bottom wall of indirect water tank 21. Irradiation device 30 irradiates the water in indirect water tank 21 with ultrasonic waves. The irradiated ultrasonic waves are provided through the water in indirect water tank 21 and a portion of cleaning tank 20 that is in contact with the water (e.g., the bottom wall) to the cleaning liquid in cleaning tank 20 and wafer W. Irradiation device 30 can generate ultrasonic waves having a frequency of 20 kHz or more and 2 MHz or less and a watt density of 0.05 W/cm2 or more and 7.0 W/cm2 or less, for example. Since the cleaning liquid and wafer W are irradiated with the ultrasonic waves in such a manner, wafer W immersed in the cleaning liquid can be efficiently cleaned. Ultrasonic waves having a frequency range of 400 kHz or more and 1 MHz or less are preferably used as the ultrasonic waves irradiated by irradiation device 30.

Monitoring device 40 includes: an extraction pipe 41 extracting a prescribed amount of the cleaning liquid from inside cleaning tank 20; a pump 42 connected to extraction pipe 41, for introducing the cleaning liquid to a dissolved nitrogen concentration meter 43; and dissolved nitrogen concentration meter 43 connected to the downstream side of pump 42. Data of the measured dissolved nitrogen concentration in the cleaning liquid is output from dissolved nitrogen concentration meter 43 to a display unit included in dissolved nitrogen concentration meter 43. An apparatus having an arbitrary configuration can be used as dissolved nitrogen concentration meter 43. For example, a measuring apparatus can be used, in which a dissolved gas component contained in the cleaning liquid is introduced into a receptor through a polymer film and a concentration of the gas component is calculated based on a change in thermal conductivity in this receptor.

Cleaning tank 20 is made of, for example, quartz glass having a thickness of 3.0 mm. Cleaning tank 20 can have an arbitrary shape. For example, a square water tank having a width of 270 mm, a depth of 69 mm and a height of 270 mm in terms of inside dimension is used as cleaning tank 20. A cleaning tank 20 with these dimensions has a capacity of 5 liters.

The thickness of the quartz glass plate material forming the bottom wall of cleaning tank 20 is preferably adjusted as appropriate, depending on the frequency of the ultrasonic waves emitted from irradiation device 30. For example, when the frequency of the ultrasonic waves emitted from irradiation device 30 is 950 kHz, the thickness of the plate material forming the bottom wall is preferably 3.0 mm. When the frequency of the ultrasonic waves emitted from irradiation device 30 is 750 kHz, the thickness of the plate material forming the bottom wall is preferably 4.0 mm, for example.

The amount of the cleaning liquid (mixed ultrapure water) supplied from supply 10 to cleaning tank 20 may be 5 liters/min. The frequency of the ultrasonic waves irradiated by irradiation device 30 may be 950 kHz and 750 kHz as described above, and an output thereof may be 1200 W (watt density of 5.6 W/cm2). A radiation surface of a vibrating plate in irradiation device 30 may have a size of 80 mm×270 mm.

The mechanism for stirring the liquid has, for example, stirring portion 4. Stirring portion 4 has a body portion 4a and a vane portion 4b. Vane portion 4b is immersed in the liquid. One end of body portion 4a is connected to, for example, a driving unit such as a motor (not shown). Stirring portion 4 is configured to be rotatable around a central axis L of body portion 4a serving as a rotation axis. In other words, stirring portion 4 is configured to be capable of stirring the liquid.

Vane portion 4b has a diameter of approximately 25 mm and a height of approximately 40 mm. Vane portion 4b has six vanes, for example. Stirring portion 4 is made of, for example, polytetrafluoroethylene (PTFE, also known under the brand name Teflon®).

Figure 2:
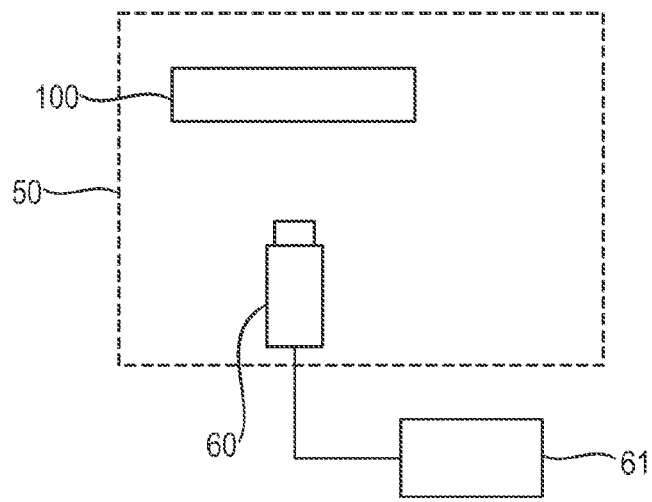
FIG. 2 shows one example of an apparatus configuration when sonoluminescence is observed.

An apparatus configuration when sonoluminescence (light emission phenomenon) is observed will be described with reference to FIG. 2. First, ultrasonic cleaning apparatus 100 and a light emission detecting apparatus 60 are disposed within a dark room 50. Light emission detecting apparatus 60 is connected to an image processing apparatus 61. An image intensifier unit (extremely weak light sensing and intensifying unit) used as light emission detecting apparatus 60 is an apparatus for sensing and intensifying extremely weak light to obtain a contrasty image. Specifically, a unit using an image intensifier (V4435U-03) manufactured by Hamamatsu Photonics K.K. can be used as this unit. In this unit, a photoelectric surface is made of Cs—Te, a sensitivity wavelength range is from 160 to 320 nm, and the highest sensitivity wavelength is 250 nm. It is believed that light emission when water is irradiated with ultrasonic waves is caused by hydroxy radical (OH radical) that occurs as a result of decomposition of the water, and the light emission has a wavelength in an ultraviolet region of around 309 nm. Therefore, the image intensifier unit having the photoelectric surface material (Cs—Te) and having the aforementioned wavelength as the sensitivity wavelength range is used. A photomultiplier may be used as light emission detecting apparatus 60. Conditions of the apparatus include, for example, an ultrasonic frequency, an ultrasonic intensity, a design of a water tank containing a solution, an amount of supply of the solution, and the like.

Next, an ultrasonic cleaning method according to the present embodiment will be described.

Figure 5:
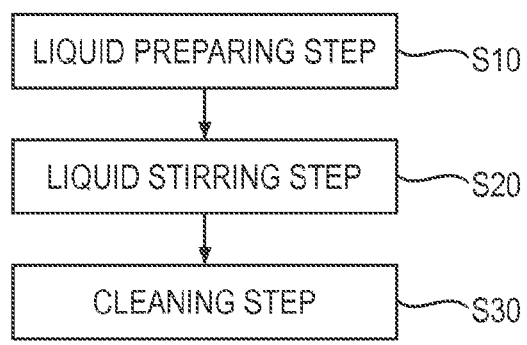
FIG. 5 is a flowchart showing an ultrasonic cleaning method according to one embodiment of the present invention.

The ultrasonic cleaning method according to the present embodiment will be described with reference to FIG. 5. The ultrasonic cleaning method according to the present embodiment is a method for cleaning wafer W (object to be cleaned) immersed in a liquid in which a gas such as nitrogen is dissolved, by irradiating the liquid with ultrasonic waves, and the method mainly has the following steps.

First, a liquid preparing step (S10) is performed. For example, using the cleaning apparatus shown in FIG. 1, ultrapure water in which a nitrogen gas is dissolved and degassed ultrapure water are mixed, and a liquid (cleaning liquid) having a desired dissolved nitrogen concentration is prepared. The dissolved nitrogen concentration in the liquid is preferably 5 ppm or more and less than 11 ppm.

Next, a liquid stirring step (S20) is performed. Specifically, the liquid prepared in the aforementioned step (S10) is irradiated with ultrasonic waves. In this state, sonoluminescence has not yet occurred. The liquid is stirred while the liquid is irradiated with the ultrasonic waves. Preferably, stirring portion 4 is driven in the liquid, and thereby the gas dissolved in the liquid generates bubbles. Specifically, stirring portion 4 shown in FIG. 1 is rotated by, for example, the motor and the like, and thereby the liquid is stirred. A rotation speed of stirring portion 4 is, for example, 1400 rpm (revolutions per minute). The rotation speed of stirring portion 4 is preferably 1400 rpm or more.

Stirring the liquid includes agitating the liquid. The liquid may also be stirred by moving stirring portion 4 vertically or horizontally, for example.

Generation of foggy bubbles in the liquid is triggered by stirring the liquid. The foggy bubbles are bubbles containing the gas (nitrogen in the present embodiment) dissolved in the liquid. In such a manner, a state where the bubbles containing nitrogen continue to be generated is realized. The phenomenon in which the minute bubbles continue to be generated due to the dissolved gas is called "cavitation phenomenon".

After the state where the bubbles containing nitrogen continue to be generated is realized, rotation of stirring portion 4 is stopped. Even after rotation of stirring portion 4 is stopped, the state where the bubbles containing nitrogen continue to be generated continues.

In the ultrasonic cleaning method according to the present embodiment, after the liquid is stirred, sonoluminescence occurs. Sonoluminescence can be sensed by the image intensifier and the photomultiplier shown in FIG. 2. Occurrence of sonoluminescence continues even after stirring of the liquid is stopped.

Next, a cleaning step (S30) is performed. In the cleaning step, wafer W, which is the object to be cleaned, is cleaned in the state where the bubbles containing nitrogen continue to be generated. It is preferable that sonoluminescence is occurring in the cleaning step.

The case where rotation of stirring portion 4 is stopped before the cleaning step is performed has been described in the present embodiment. However, stirring portion 4 may be rotated in the cleaning step. Alternatively, rotation of stirring portion 4 may be stopped during the cleaning step.

Next, a hypothesis about a mechanism of a chain reaction of the cavitation phenomenon that is caused by generating the bubbles in the liquid and a resulting increase in the particle removal rate will be described with reference to FIGS. 3(*a*) to 3(*e*).

Figure 3:
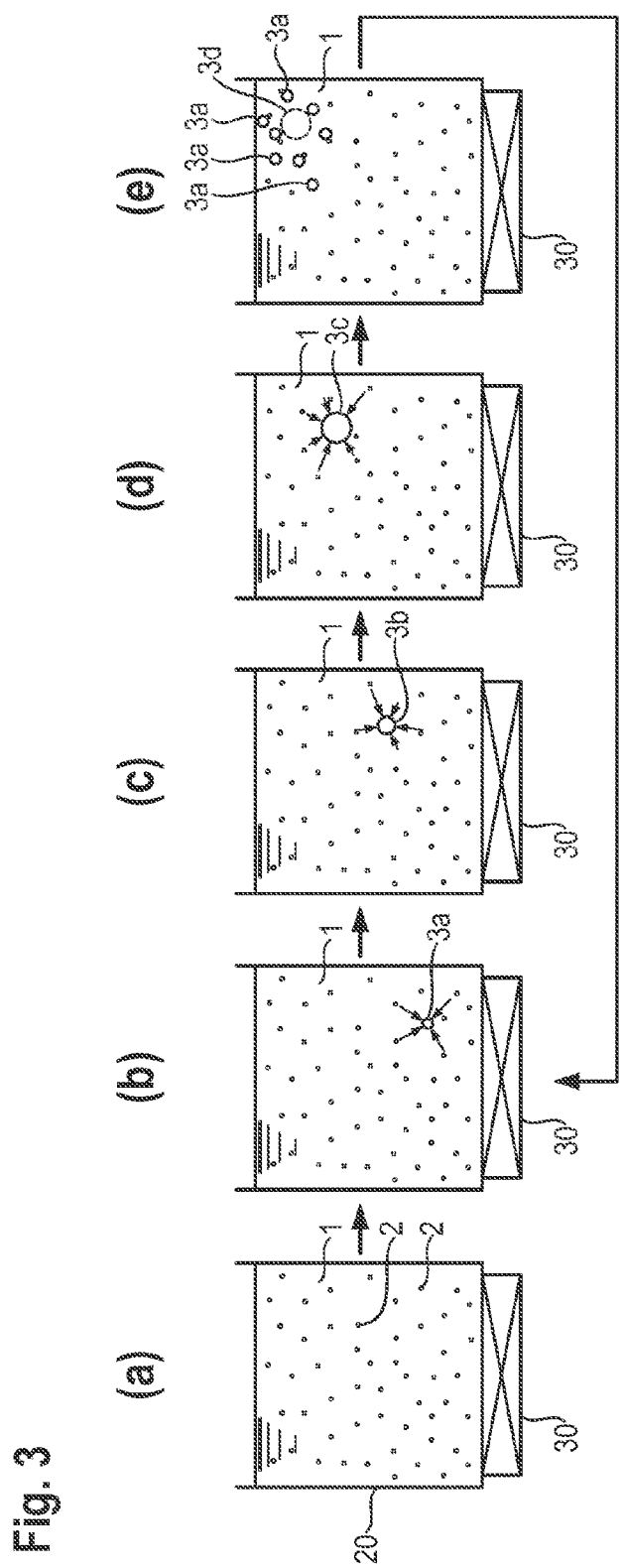
FIG. 3(a) is a diagram for describing a state of a bubble in a supersaturated state.
FIG. 3(b) is a diagram for describing a state of a bubble in a nucleus formation state.
FIG. 3(c) is a diagram for describing a state of a bubble in a bubble growth state.
FIG. 3(d) is a diagram for describing a state of a bubble in a bubble growth state.
FIG. 3(e) is a diagram for describing a state of a bubble in a bubble burst state.

Referring to FIG. 3(*a*), a liquid 1 in which nitrogen 2 is dissolved is irradiated with ultrasonic waves by irradiation device 30. In this liquid, nitrogen 2 is supersaturated. Referring to FIG. 3(*b*), the stirring portion (not shown) is rotated in the liquid, and thereby a bubble 3*a* is generated in the liquid. Bubble 3*a* serves as a nucleus and the neighboring dissolved gas gathers around bubble 3*a*. Referring to FIGS. 3(*c*) and 3(*d*), a grown bubble 3*b* moves through the liquid while collecting the neighboring dissolved gas one after another, and grows into a bubble 3*c* having a size that resonates with the ultrasonic waves. Referring to FIG. 3(*e*), a bubble 3*d* that has grown to the size that resonates with the ultrasonic waves bursts and produces a plurality of small bubbles 3*a*. It is considered that the burst of bubble 3*d* causes a shock wave in the liquid, which allows removal of particles attached to an object to be cleaned. The plurality of small bubbles 3*a* also serve as nuclei and start to collect the neighboring dissolved gas. In such a manner, the bubbles containing the dissolved gas are generated continuously. Regarding a change in the bubbles shown in FIGS. 3(*b*) to 3(*e*) as one loop, this loop is repeated approximately 1000 times or more in one second.

It is considered that stirring the liquid means supply of the first bubble that triggers the chain reaction of generation of the bubbles. In other words, it is considered that application of external force to the liquid in some way allows creation of the state where the bubbles are more likely to be generated in the liquid.

Next, the function and effect of the present embodiment will be described.

In the ultrasonic cleaning method according to the present embodiment, the liquid is stirred while the liquid is irradiated with the ultrasonic waves. Therefore, it is possible to realize the state where the bubbles containing the gas dissolved in the liquid are more likely to be generated continuously. Since cleaning is done in this state, a high particle removal rate can be obtained in a stable manner.

In addition, in the ultrasonic cleaning method according to the present embodiment, the step of realizing the state where the bubbles containing the gas continue to be generated is triggered by driving stirring portion 4 in the liquid and generating bubbles from the dissolved gas. With this, generation of the bubbles serving as nuclei is promoted on the surface of stirring portion 4, and the cleaning effect can be enhanced.

Furthermore, in the ultrasonic cleaning method according to the present embodiment, the step of cleaning the object to be cleaned includes a step in which sonoluminescence occurs. With this, a high particle removal rate is obtained in a more stable manner.

In the ultrasonic cleaning apparatus according to the present embodiment, the liquid can be stirred by stirring portion 4 and it is possible to realize the state where the bubbles serving as nuclei are more likely to be generated in the liquid. As a result, the cleaning effect can be enhanced and a high particle removal rate is obtained in a stable manner.

EXAMPLE 1

An object of this experiment is to verify a difference in the rate of removal of particles attached to wafer W between the cleaning method according to the present invention and a cleaning method according to a comparative example that are used to clean wafer W.

First, a cleaning apparatus used in this experiment will be described with reference to FIG. 1. The square water tank made of quartz glass having a thickness of 3.0 mm was used as cleaning tank 20 in the experiment. The water tank had a width of 270 mm, a depth of 69 mm and a height of 270 mm in terms of inside dimension. The plate material forming the bottom wall had a thickness of 4.0 mm. Cleaning tank 20 had a capacity of 5 liters.

The amount of the cleaning liquid (mixed ultrapure water) supplied from supply 10 to cleaning tank 20 was 5 liters/min. The frequency of the ultrasonic waves irradiated by irradiation device 30 was 750 kHz and the output thereof was 1200 W (watt density of 5.6 W/cm2). The radiation surface of the vibrating plate in irradiation device 30 had a size of 80 mm×285 mm. The ultrasonic waves emitted from irradiation device 30 were provided onto the entire bottom surface of cleaning tank 20.

First supply valve 11 adjusting the amount of supply of the ultrapure water in which the nitrogen gas was dissolved and second supply valve 12 adjusting the amount of supply of the degassed water were controlled, and thereby the ultrapure water in which nitrogen was dissolved was supplied to cleaning tank 20 at 5 liters/min. The ultrapure water in the water tank was sampled and the dissolved nitrogen concentration was measured by monitoring device 40.

Next, an object to be cleaned that is used to measure the particle removal rate will be described.

A P-type silicon wafer having a diameter of 200 mm was used as the object to be cleaned. Silicon dioxide particles were attached to a mirror surface of the P-type silicon wafer by spin coating. An amount of attachment was 2000 to 3000 particles in the case of the particles of 110 nm or more.

Next, a method for measuring the particle removal rate will be described.

The wafer having the silicon dioxide particles attached thereto was immersed in the water tank and cleaned for 10 minutes. Thereafter, the wafer was dried for 2 minutes by a spin dryer. The particle removal rate is obtained as a value acquired by dividing the number of particles that decrease after cleaning by the number of particles attached to the wafer before cleaning, and this value is expressed as a percentage. LS6500 manufactured by Hitachi High-Technologies Corporation was used to measure an amount of particle attachment.

Example According to the Present Invention

The cleaning method according to an example of the present invention will be described. First, a cleaning liquid whose dissolved nitrogen concentration was adjusted to 7.1 ppm was prepared. This cleaning liquid was irradiated with ultrasonic waves by irradiation device 30. The frequency of the irradiated ultrasonic waves was 750 kHz and the output thereof was 1200 W. The cleaning liquid was continuously irradiated with the ultrasonic waves. Stirring portion 4 was rotated in the cleaning liquid at 1400 rpm while the cleaning liquid was irradiated with the ultrasonic waves. Vane portion 4b of stirring portion 4 had a diameter of approximately 25 mm and a height of 40 mm. Stirring portion 4 was rotated, and thereby foggy bubbles were generated in the cleaning liquid. At this point, an observation by the image intensifier unit was conducted. Then, occurrence of sonoluminescence was seen. Wafer W having the silicon dioxide particles attached thereto, which was the object to be cleaned, was immersed in the liquid having the foggy bubbles, and wafer W was cleaned for 10 minutes, and thereafter, wafer W was dried for 2 minutes by the spin dryer.

Comparative Example

Next, the cleaning method according to the comparative example will be described. First, a cleaning liquid whose dissolved nitrogen concentration was adjusted to 7.1 ppm was prepared. This cleaning liquid was irradiated with ultrasonic waves by irradiation device 30. The frequency of the irradiated ultrasonic waves was 750 kHz and the output thereof was 1200 W. The cleaning liquid was continuously irradiated with the ultrasonic waves. Unlike the cleaning method according to the example of the present invention, the cleaning liquid was not stirred by stirring portion 4 in the cleaning method according to the comparative example. An observation by the image intensifier unit was conducted. Then, occurrence of sonoluminescence was not seen. Wafer W having the silicon dioxide particles attached thereto, which was the object to be cleaned, was immersed in the liquid, and wafer W was cleaned for 10 minutes, and thereafter, wafer W was dried for 2 minutes by the spin dryer.

Particle Removal Rate

Next, a result of the particle removal rate will be described. The particle removal rate in the cleaning method according to the comparative example was 18.8%. On the other hand, the particle removal rate in the cleaning method according to the example of the present invention was 30.0%. Based on this experiment, it was seen that by stirring the cleaning liquid while irradiating the cleaning liquid with the ultrasonic waves, the particle removal rate is increased.

EXAMPLE 2

An object of this experiment is to examine a range of the dissolved nitrogen concentration for generating the foggy bubbles in the cleaning liquid.

First, seven types of cleaning liquids having dissolved nitrogen concentrations of 1.9 ppm, 4.9 ppm, 6.0 ppm, 7.8 ppm, 9.6 ppm, 11.0 ppm, and 15.7 ppm, respectively, were prepared. Stirring portion 4 was rotated to stir each of these seven types of cleaning liquids, while each of the cleaning liquids was irradiated with ultrasonic waves. The rotation speed of stirring portion 4 was 1400 rpm. The frequency of the irradiated ultrasonic waves was 750 kHz and the output thereof was 1200 W. After the cleaning liquids were stirred, it was observed whether or not the foggy bubbles were generated in the cleaning liquids.

Figure 4:
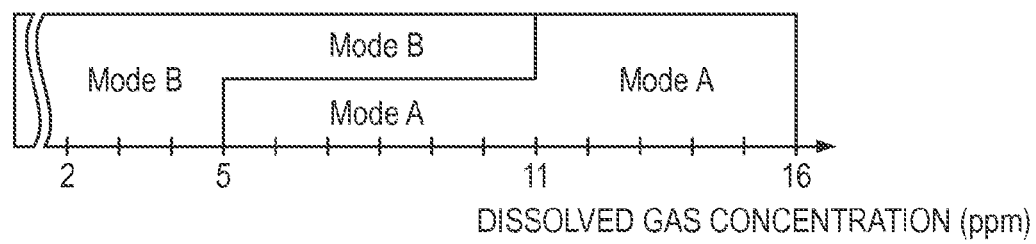
FIG. 4 is a schematic view showing a relationship between the dissolved nitrogen concentration and the presence or absence of foggy bubbles.

A result of this experiment will be described with reference to FIG. 4. In the specification, a state where the foggy bubbles are generated in the cleaning liquid will be referred to as "Mode-A", and a state where the foggy bubbles are not generated in the cleaning liquid will be referred to as "Mode-B". Alternatively, Mode-A refers to a state where the particle removal rate is high, i.e., approximately 30.0%, and Mode-B refers to a state where the particle removal rate is low, i.e., approximately 18.8%.

When the dissolved nitrogen concentration was 4.9 ppm or less, the foggy bubbles were not observed in the cleaning liquids (Mode-B). When the dissolved nitrogen concentration was 6.0 ppm or more and 9.6 ppm or less, the foggy bubbles were not generated in the cleaning liquids (Mode-B) before the cleaning liquids were stirred by stirring portion 4. However, the foggy bubbles were generated in the cleaning liquids (Mode-A) after the cleaning liquids were stirred by stirring portion 4. Furthermore, when the dissolved nitrogen concentration was 11.0 ppm or more and 15.7 ppm or less, the foggy bubbles were generated in the cleaning liquids (Mode-A) before and after the cleaning liquids were stirred by stirring portion 4. Based on the aforementioned experiment, it is considered that by stirring the cleaning liquid when the dissolved nitrogen concentration in the cleaning liquid is 5 ppm or more and less than 11 ppm, the state of the cleaning liquid can be changed from Mode-B to Mode-A.

It should be understood that the embodiment and the examples disclosed herein are illustrative and not limitative in any respect. The scope of the present invention is defined by the terms of the claims, rather than the embodiment and the examples above.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B." Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise.

DESCRIPTION OF THE REFERENCE CHARACTERS 1 liquid
2 gas 3 bubble
4 stirring portion
4a body portion
4b vane portion
10 supply
11 first supply valve
12 second supply valve
20 cleaning tank
21 indirect water tank
22 holding portion
23 liquid introducing pipe
30 irradiation device
40 monitoring device
41 extraction pipe
42 pump
43 dissolved nitrogen concentration meter
50 dark room
60 light emission detecting apparatus
61 image processing apparatus
100 ultrasonic cleaning apparatus
W wafer

What is claimed is:

1. An ultrasonic cleaning method for cleaning an object in a liquid in which a gas is dissolved, the method comprising:
preparing the liquid in which the gas is dissolved;
stirring the liquid at a rotation speed of at least 1400 rpm while irradiating the liquid with the ultrasonic waves so as to realize a state where bubbles containing the gas dissolved in the liquid continue to be generated; and
cleaning the object in the state where the bubbles containing the gas continue to be generated and sonoluminescence occurs,
wherein the stirring of the liquid is performed using a stirring portion having a vane portion immersed in the liquid and a body portion, where the stirring portion is rotatable around a central axis of the body portion.

2. The ultrasonic cleaning method as recited in claim 1, wherein the realizing the state where bubbles containing the gas continue to be generated is triggered by driving a stirring portion in the liquid.

3. The ultrasonic cleaning method as recited in claim 1, wherein the gas is nitrogen and a dissolved gas concentration in the liquid is at least 5 ppm and less than 11 ppm.

4. The ultrasonic cleaning method as recited in claim 1, wherein the ultrasonic waves have a frequency in a range of 20 kHz or more to 2 MHz or less.

5. The ultrasonic cleaning method as recited in claim 1, wherein the ultrasonic waves have a frequency in a range of 400 kHz or more to 1 MHz or less.

6. The ultrasonic cleaning method as recited in claim 1, wherein the ultrasonic waves have a frequency in a range of 400 kHz or more to 950 kHz.

7. The ultrasonic cleaning method as recited in claim 1, wherein the ultrasonic waves have a frequency in a range of 400 kHz or more to 750 kHz.

8. The ultrasonic cleaning method as recited in claim 1, wherein the gas is nitrogen and a dissolved gas concentration in the liquid is at least 6.0 ppm and less than 11.0 ppm.

9. The ultrasonic cleaning method as recited in claim 1, wherein the gas is nitrogen and a dissolved gas concentration in the liquid is at least 7.8 ppm and less than 11.0 ppm.

10. The ultrasonic cleaning method as recited in claim 1, wherein the gas is nitrogen and a dissolved gas concentration in the liquid is at least 7.8 ppm and less than 9.6 ppm.

11. The ultrasonic cleaning method as recited in claim 1, wherein the object is a wafer comprising silicon.

12. The ultrasonic cleaning method as recited in claim 1, wherein the object is a P-type silicon wafer.

13. The ultrasonic cleaning method as recited in claim 1, wherein the liquid comprises water.

14. The ultrasonic cleaning method as recited in claim 2, wherein the gas is nitrogen and a dissolved gas concentration in the liquid is at least 5 ppm and less than 11 ppm.

15. An ultrasonic cleaning method for cleaning a wafer in a liquid in which a gas is dissolved, the method comprising:
stirring a liquid in which the wafer is immersed, the liquid comprising a dissolved gas at a concentration in a range of more than 5 ppm to 11.0 ppm, at a rotation speed of at least 1400 rpm while irradiating the liquid with the ultrasonic waves so as to realize a state of sonoluminescence and continuous generation of bubbles comprising the gas dissolved in the liquid, thereby cleaning the wafer.

16. The ultrasonic cleaning method as recited in claim 15, wherein the gas comprises at least 6.0 ppm of nitrogen.

17. The ultrasonic cleaning method as recited in claim 15, wherein the gas comprises at least 7.8 ppm of nitrogen.

18. The ultrasonic cleaning method as recited in claim 15, wherein the gas comprises at least 9.6 ppm of nitrogen.

19. The ultrasonic cleaning method as recited in claim 15, wherein the wafer comprises silicon.

* * * * *